US011462421B2

(12) United States Patent
Cho et al.

(10) Patent No.: US 11,462,421 B2
(45) Date of Patent: Oct. 4, 2022

(54) APPARATUS FOR COLLECTING BY-PRODUCT OF SEMICONDUCTOR MANUFACTURING PROCESS

(71) Applicant: MILAEBO CO., LTD., Pyeongtaek-si (KR)

(72) Inventors: Che Hoo Cho, Seongnam-si (KR); Yeon Ju Lee, Osan-si (KR); Ji Su Kim, Pyeongtaek-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 724 days.

(21) Appl. No.: 16/433,121

(22) Filed: Jun. 6, 2019

(65) Prior Publication Data

US 2020/0321226 A1    Oct. 8, 2020

(30) Foreign Application Priority Data

Apr. 2, 2019 (KR) .......................... 10-2019-0038416

(51) Int. Cl.
*H01L 21/67* (2006.01)
*C23C 16/44* (2006.01)
*B01D 51/02* (2006.01)

(52) U.S. Cl.
CPC ........ *H01L 21/67017* (2013.01); *B01D 51/02* (2013.01); *C23C 16/4412* (2013.01)

(58) Field of Classification Search
CPC ........ H01L 21/67017; H01L 21/67109; H01L 21/67098; B01D 51/02; B01D 47/12; B01D 46/12; B01D 2257/204; B01D 2258/0216; B01D 53/005; Y02C 20/30; C23C 16/4412; C23C 16/14; Y02P 70/50
See application file for complete search history.

(56) References Cited

FOREIGN PATENT DOCUMENTS

| KR | 10-0595010 B1 | 6/2006 | |
|---|---|---|---|
| KR | 10-0676927 B1 | 2/2007 | |
| KR | 10-0698379 B1 | 3/2007 | |
| KR | 10-0717837 B1 | 5/2007 | |
| KR | 10-0862684 B1 | 10/2008 | |
| KR | 10-1447629 B1 | 10/2014 | |
| KR | 10-2015-0080195 A | 7/2015 | |
| KR | 10-1840332 B1 | 5/2018 | |
| WO | WO-2007086700 A1 * | 8/2007 | ......... B01D 53/0407 |

* cited by examiner

*Primary Examiner* — Karen Kusumakar
(74) *Attorney, Agent, or Firm* — Rabin & Berdo, P.C.

(57) ABSTRACT

Disclosed is an apparatus for collecting a by-product in a semiconductor manufacturing process, the apparatus including: a heating jacket provided detachably along an outer circumference of a housing unit to provide a uniform temperature in a space into which exhaust gas containing tungsten hexafluoride ($WF_6$) discharged after being used in a semiconductor manufacturing process flows; an upper internal collecting tower having first collecting plates and second collecting plates alternately arranged at regular intervals in a vertical direction to realize sufficient moving path and time in a narrow space; and a lower internal collection tower having third collecting plates arranged at regular intervals in the vertical direction, the third collecting plates having different regions on each surface thereof such that each of the third collecting plates is misaligned with a next third collecting plate to realize sufficient moving path and time in a narrow space.

18 Claims, 16 Drawing Sheets

APPARATUS FOR COLLECTING BY-PRODUCT OF SEMICONDUCTOR MANUFACTURING PROCESS

CROSS REFERENCE TO RELATED APPLICATION

The present application claims priority to Korean Patent Application No. 10-2019-0038416, filed Apr. 2, 2019, the entire contents of which is incorporated herein for all purposes by this reference.

BACKGROUND OF THE INVENTION

Field of the Invention

The present invention relates to an apparatus for collecting a by-product in a semiconductor manufacturing process. More particularly, the present invention relates to an apparatus for collecting a by-product, the apparatus being configured to maintain a reaction temperature therein uniformly at a high temperature to efficiently collect a by-product containing tungsten hexafluoride in exhaust gas components discharged to a scrubber after physical and chemical processes of depositing a thin film on a wafer in a process chamber and etching the wafer, and the apparatus being also configured to realize sufficient collection paths and to facilitate cleaning the apparatus.

Description of the Related Art

Generally, a semiconductor manufacturing process is roughly classified into a fabrication process and an assembly process.

The fabrication process is a process for manufacturing semiconductor chips on which a predetermined pattern is formed by repeating a process in which a thin film is deposited on a wafer in various process chambers and the deposited thin film is selectively etched.

The assembly process is a process of individually cutting the chips manufactured on the wafer in the fabrication process, and then joining the cut chip with a lead frame to assemble into the finished product. In detail, the fabrication process is a process of depositing a thin film on the wafer or etching a thin film deposited on the wafer. The process is performed at a high temperature by supplying process gases such as silane ($SiH_4$), arsine, boron chloride, and hydrogen, and tungsten hexafluoride ($WF_6$) into a process chamber. During the process, a large amount of various ignitable gases and hazardous gases containing corrosive foreign substances and toxic components are produced in the process chamber.

Therefore, in order to purify and discharge such hazardous gases, the semiconductor manufacturing equipment is provided with: a vacuum pump evacuating the process chamber; and a scrubber provided at a rear end of the vacuum pump to purify the exhaust gas discharged from the process chamber and to discharge the exhaust gas to the atmosphere.

However, the scrubber only treats and removes a by-product which is in a form of gas. Thus, when the by-product is discharged to the outside of the process chamber and then solidified, the by-product is adhered to an exhaust line, leading to increasing exhaust pressure. In addition, the by-product is introduced into the vacuum pump and causes a failure of the vacuum pump and backflow of the hazardous gas, leading to contamination of the wafer in the process chamber.

Therefore, the semiconductor manufacturing equipment is provided with an apparatus for collecting a by-product between the process chamber and the vacuum pump to coagulate the exhaust gas discharged from the process chamber into a powder form.

Tungsten hexafluoride ($WF_6$) and silane ($SiH_4$) are used as process gases to be introduced into the process chamber in a fabrication process. Tungsten hexafluoride ($WF_6$) is used for forming metal contacts and gates on the wafer, and silane ($SiH_4$) is used for forming a silicon insulating film or the like.

The temperature of process gases containing tungsten hexafluoride ($WF_6$) is lowered as the process gases are discharged to the outside after the reaction in the process chamber and then moved to the apparatus through the exhaust pipe. Thus, in order to efficiently collect tungsten hexafluoride ($WF_6$) gas, a high temperature of 200° C. or higher is required and kept constant.

However, in general, the conventional apparatus is provided with a heater only at an upper portion thereof into which the exhaust gas discharged after the process gases are consumed in the process chamber is introduced. Thus, a tungsten hexafluoride ($WF_6$) byproduct is mainly collected in an upper space of the apparatus, so that the utilization efficiency of the collecting space is decreased and thus the overall efficiency of collecting a by-product from tungsten hexafluoride ($WF_6$) gas is decreased.

In order to solve the problem, there is an apparatus for collecting a by-product, the apparatus provided with an additional heating device therein to efficiently coagulate and collect the exhaust gas containing tungsten hexafluoride ($WF_6$) and the apparatus providing a high temperature therein uniformly. However, the apparatus is designed to have a dedicated heating device, so that the internal structure thereof is complicated.

In addition, the conventional apparatus for collecting the exhaust gas containing tungsten hexafluoride ($WF_6$) has a problem in structure in that the sufficient distance for gas movement cannot be secured in a state where the reaction space is narrow and limited and the high internal temperature is maintained such that tungsten hexafluoride ($WF_6$) is sufficiently reacted and discharged without being captured.

In addition, due to the structural characteristic in which the heating device is provided inside the apparatus, the heating device is continuously exposed to the exhaust gas. Therefore, the durability thereof is lowered due to corrosion or deterioration, and the repairing or replacement cycle is short so that the continuous operation is difficult and the maintenance cost is increased.

The apparatus for collecting the exhaust gas containing tungsten hexafluoride ($WF_6$) is subjected to a cleaning process in which an internal collecting tower provided in the inner space of a housing of the apparatus is removed and then sandblasted. Thus, there is a problem in structure in terms of the cleaning process that, as the cleaning process is repeated, an inner wall of the housing of the apparatus is required to be replaced when damage occurs due to impact by sands sprayed at a high pressure.

DOCUMENTS OF RELATED ART (Patent Document 0001) Korean Patent No. 10-0595010, issued on Jun. 22, 2006;
(Patent Document 0002) Korean Patent No. 10-0717837, issued on May 7, 2007;
(Patent Document 0003) Korean Patent No. 10-0862684, issued on Oct. 2, 2008; and (Patent Document 0004) Korean Patent No. 10-1447629, issued on Sep. 29, 2014.

SUMMARY OF THE INVENTION

Accordingly, the present invention has been made keeping in mind the above problems occurring in the related art, and an objective of the present invention is intended to provide an apparatus for collecting a by-product in a semiconductor manufacturing process, the apparatus including: a heating jacket provided detachably on a housing unit to provide a uniform temperature in the collecting space into which exhaust gas containing tungsten hexafluoride ($WF_6$) discharged after being used in a semiconductor manufacturing process flows such that a collecting region is adjusted; and upper and lower internal collecting towers configured to realize sufficient moving path and time in a narrow collecting space to collect the by-product efficiently.

It is another objective of the present invention to provide an apparatus for collecting a by-product in a semiconductor manufacturing process, the apparatus having a housing unit configured to prevent an inner wall surface of a housing main body from being damaged when cleaning a space inside the housing unit by a sand blasting method after the by-product collecting process, and configured to be quickly replaceable when the cleaning is difficult.

In order to achieve the above objective, there is provided an apparatus for collecting a by-product in a semiconductor manufacturing process, the apparatus provided on a line between a process chamber and a vacuum pump and the apparatus including: a housing unit providing a space where exhaust gas discharged from the process chamber and containing tungsten hexafluoride ($WF_6$) is accommodated to collect a by-product from the exhaust gas and where the by-product is coagulated and collected, the housing unit having an upper plate provided with an inlet at an upper portion thereof and a lower plate provided with an outlet at a lower portion thereof; a heater heating the exhaust gas introduced into the housing unit; and an internal collecting tower coagulating the exhaust gas and collecting the by-product. The apparatus further includes: a heating jacket detachably provided along an outer circumference of the housing unit to provide heat; an upper internal collecting tower configured such that multiple first collecting plates and multiple second collecting plates having different shapes are alternately arranged at regular intervals in a vertical direction such that the exhaust gas flows inward and outward alternately, thereby forming a serpentine flow according to the shapes of the first collecting plates and the second collecting plates while the exhaust gas flows downward and thus the by-product is collected; and a lower internal collection tower configured such that multiple third collecting plates having the same shape are arranged at regular intervals in the vertical direction and each of the third collecting plates has different regions on a surface thereof such that each region of each of the third collecting plates is misaligned with a corresponding one of the regions of a next third collecting plate, thereby the exhaust gas flows downward along the shapes of the regions of the third collecting plates and thus the by-product is collected.

The upper internal collecting tower and the lower internal collecting tower may be vertically spaced apart from each other at a predetermined distance.

The heating jacket may be configured such that a heating wire provided to generate heat is positioned in a predetermined region.

The heating jacket may be configured such that the heat of the heating wire is transmitted only to an upper portion and a middle portion of the housing unit.

Each of the first collecting plates may include: a main exhaust hole formed in a central portion and an auxiliary exhaust hole formed around the central portion to discharge the exhaust gas downward; and guide brackets and interference brackets provided on an upper surface of the first collecting plate, the guide brackets and the interference brackets being cross-assembled together and functioning to guide the exhaust gas to flow at predetermined angles and to delay a flow of the exhaust gas, respectively.

Each of the second collecting plates may have a closed structure to discharge the exhaust gas radially and may include guide brackets and interference brackets cross-assembled together on an upper surface thereof to guide the exhaust gas to flow at predetermined angles and to delay a flow of the exhaust gas, respectively.

Each of the third collecting plates may include a mesh region and a perforated region in which multiple circular holes are arranged.

The mesh region may be fixed to a region of each of the third collecting plates which is processed to have an opening according to a shape of a mesh by upper and lower guides.

Surfaces of the first collecting plates, the second collecting plates, and the third collecting plates may be roughly processed to increase a contact area and to delay a flow of the exhaust gas.

The first collecting plates and second collecting plates may be configured such that guide brackets provided on upper surfaces of the first collecting plates and the second collecting plates placed on top of another are arranged radially in a manner being misaligned with each other to form a serpentine flow of the exhaust gas.

Multiple tubular spacers may be provided to space the first collecting plates and the second collecting plates apart from each other in the vertical direction and space the third collecting plates apart from each other in the vertical direction, wherein the spacers are arranged along a circumferential direction, and fastening rods passing through fixing rod through-holes formed in the first collecting plates, the second collecting plates, and the third collecting plates pass through the spacers to fix the first collecting plates, the second collecting plates, and the third collecting plates.

Surfaces of the guide brackets and the interference brackets may be roughly processed to increase a contact area and to delay the flow of the exhaust gas.

The housing unit may include: a housing main body; a cylindrical inner housing being replaceable and provided in a manner being brought into contact with an inner wall surface of the housing main body; and cylindrical housing rings provided at upper and lower portions of the housing main body respectively in a manner being fastened to upper and lower portions of an inner wall of the inner housing to fasten the inner housing to the inside of the housing main body.

An upper portion of the upper plate may be configured such that a coolant flow path is provided on an upper surface of the upper plate for temperature control to collect the by-product introduced into the housing unit. A lower portion of the upper plate may be configured with multiple fasteners such that some of the fasteners are fastened with fastening rods passing through the upper internal collecting tower so that the upper internal collecting tower is suspended thereby, and the remaining fastening rods are fastened with the heater to fix the heater.

The lower plate may include: multiple spacers provided upward to space the lower internal collecting tower apart from the bottom by a predetermined distance; and fastening rods provided in each of the spacers and passing through the lower internal collecting tower to fasten and support the lower internal collecting tower.

The heater may include: a heat radiating portion provided at an upper portion thereof and having multiple radiating fins radially arranged to radiate heat uniformly; and a protection cap surrounding the heater to protect the heater.

The apparatus may further include: a transfer unit having multiple legs provided under the lower plate and casters provided under each of the legs.

Process gas containing tungsten hexafluoride ($WF_6$) is reacted in a process chamber during a semiconductor manufacturing process and discharged to an apparatus for collecting a by-product having the above-described characteristics according to the present invention. Until the exhaust gas introduced into the apparatus is discharged from the apparatus, a region inside a housing unit where a by-product is collected can be uniformly maintained at a high temperature provided by a heater and a heating jacket, so that the exhaust gas is coagulated and the by-product is collected efficiently.

According to the present invention, multiple first collecting plates and multiple second collecting plates having different shapes are alternately arranged at regular intervals in a vertical direction such that the exhaust gas flows inward and outward alternately, thereby forming a serpentine flow according to the shapes of the first collecting plates and the second collecting plates while the exhaust gas flows downward. Alternatively, it is possible to delay the flowing time of the exhaust gas on the collecting plates according to an installation angle or a position of brackets provided on the collecting plates. Accordingly, the distance and time for the exhaust gas to contact with the collecting plates are increased, so sufficient contact area and time required for coagulation are provided, and thus the by-product is collected efficiently.

According to the present invention, multiple third collecting plates having the same shape are arranged at regular intervals in the vertical direction and each of the third collecting plates has different regions on a surface thereof such that each region of each of the third collecting plates is misaligned with a corresponding one of the regions of a next third collecting plate, thereby the exhaust gas flows downward along the shapes of the regions of the third collecting plates and thus the by-product is collected. Accordingly, the exhaust gas containing $WF_6$ flows downward while the flow velocity thereof is continuously changed. Therefore, the time for the exhaust gas to contact with the collecting plates is increased, so sufficient contact area and time required for coagulation are provided, and thus the by-product is collected efficiently.

According to the present invention, the apparatus is provided with an upper internal collecting tower and a lower internal collecting tower each having multiple plates of different shapes, and with a heating jacket surrounding the housing unit from the outside and having a heating wire provided only at an upper portion and a middle portion of the housing unit. Therefore, a $WF_6$ by-product is collected mainly at the upper and middle portions of the housing unit, and fine particulate by-products of the exhaust gas other than the $WF_6$ by-product is collected at a lower portion of the housing unit. Accordingly, the discharge of the $WF_6$ by-product through an outlet is maximally suppressed, thereby effectively suppressing damage of a scrubber or a vacuum pump connected to a rear end of the outlet.

According to the present invention, surfaces of the collecting plates constituting the upper and lower internal collecting towers are roughly processed to increase the contact area where the exhaust gas containing $WF_6$ is coagulated, so that the by-product is collected efficiently.

According to the present invention, since the heating jacket is provided detachably on the outside the housing unit, the apparatus has a simple structure. In addition, the housing unit is provided with no structure for heating the inside thereof whereby it is easy to remove and replace or repair the heating jacket provided on the outside. Therefore, the conventional problem that a heating device may be damaged when cleaning the apparatus can be fundamentally solved.

According to the present invention, when the heating jacket having different heating wire disposement is provided on the housing unit, a region of the apparatus where the $WF_6$ by-product is collected can be variously changed without changing the structure inside the housing unit.

According to the present invention, in order to prevent the durability of the heater provided below the upper plate from being lowered due to corrosion which may occur during operation with long exposure to the exhaust gas with high temperature, a protection cap is provided around the heater to protect the heater so that the durability of the heater can be improved.

According to the present invention, the housing unit is constituted by the housing main body and a replaceable inner housing provided in the housing main body. Thus, even when the inner space of the housing unit is cleaned by sandblasting after the by-product collecting process, the inner wall surface of the housing main body is free from damage. In addition, when the inner housing is damaged and it is difficult to clean the damaged inner housing, the inner housing can be quickly replaced and the apparatus can be operated continuously.

As described above, the present invention is useful, effectively collecting the by-product of the exhaust gas containing $WF_6$ and facilitating cleaning of the housing unit and cleaning operation of the housing unit, so that the present invention is highly expected to be applicable in the industry.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, specific structural and functional descriptions of embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted.

Figure 1:
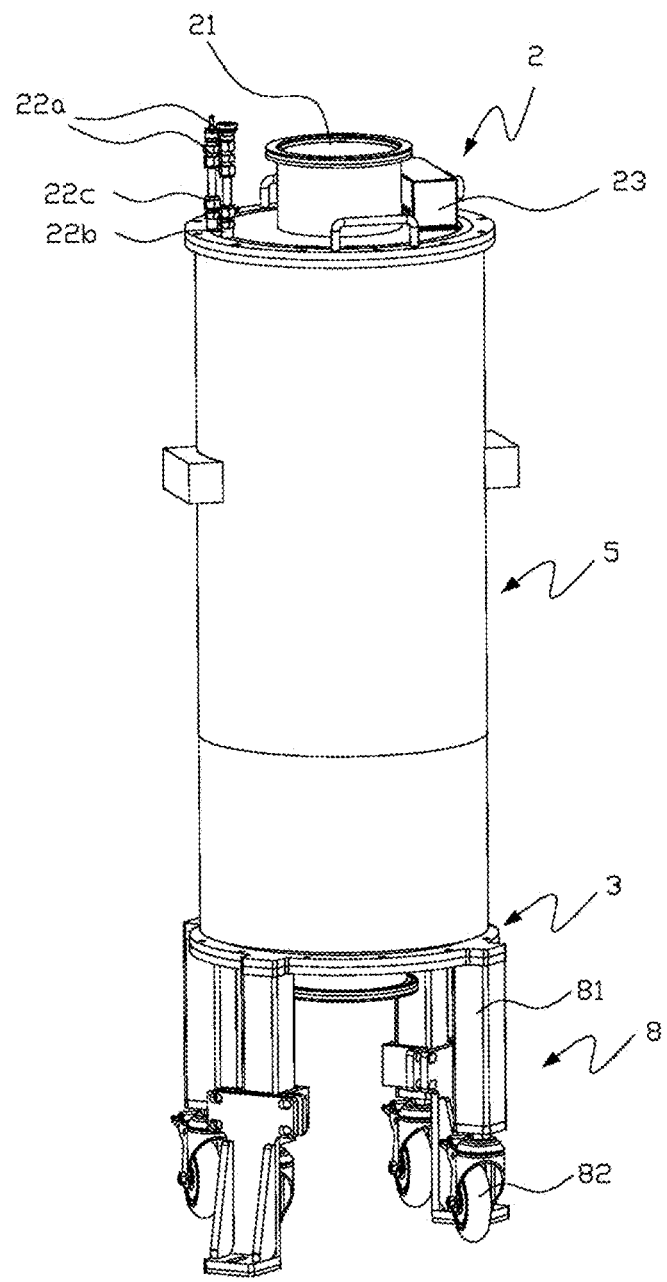
FIG. 1 is a perspective view of an apparatus for collecting a by-product according to an embodiment of the present invention.
Figure 2:
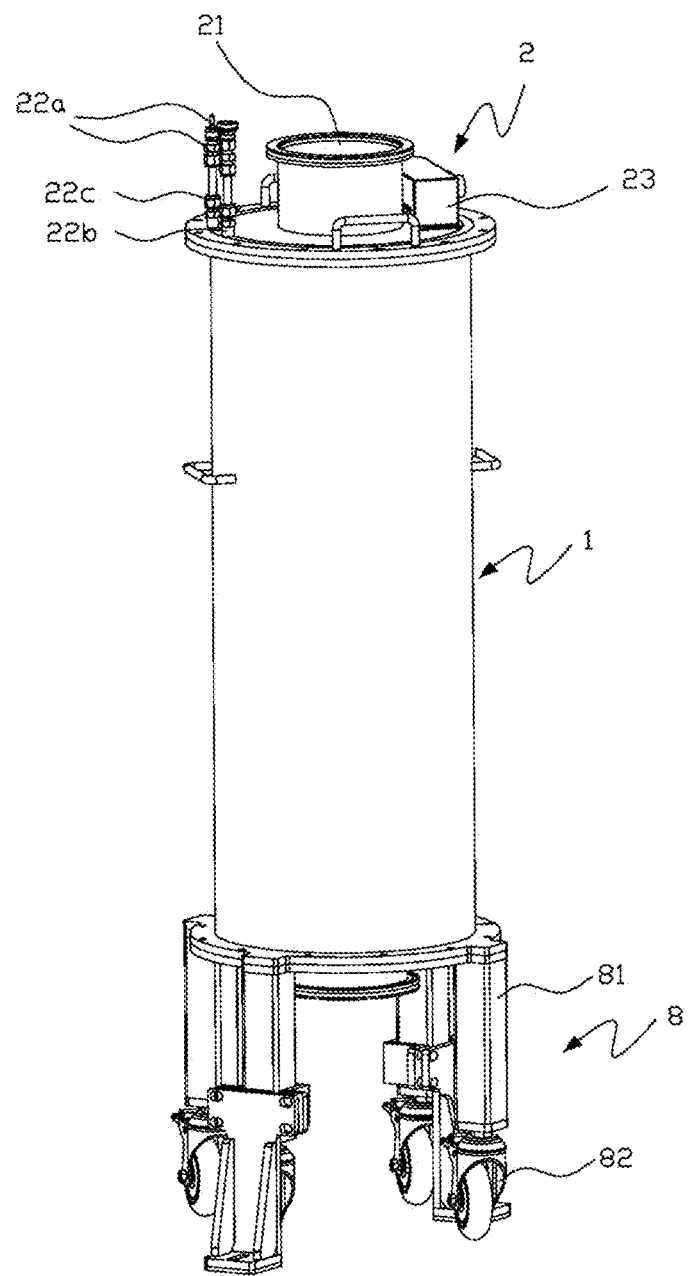
FIG. 2 is an exploded-perspective view of the apparatus for collecting a by-product in which a heating jacket is removed according to the embodiment of the present invention.
Figure 3:
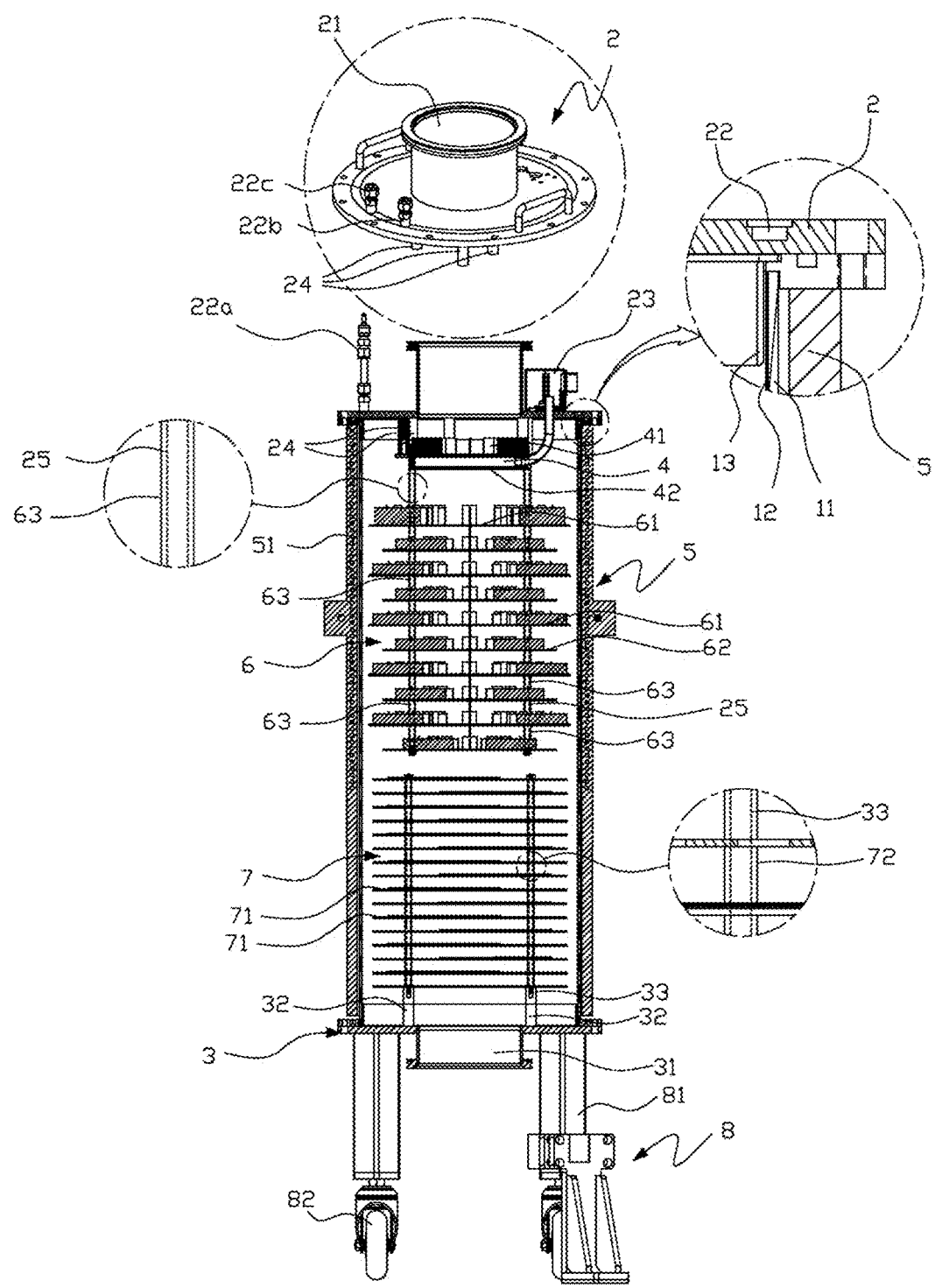
FIG. 3 is a cross-sectional view of an internal structure of the apparatus for collecting a by-product according to the embodiment of the present invention.
Figure 4:
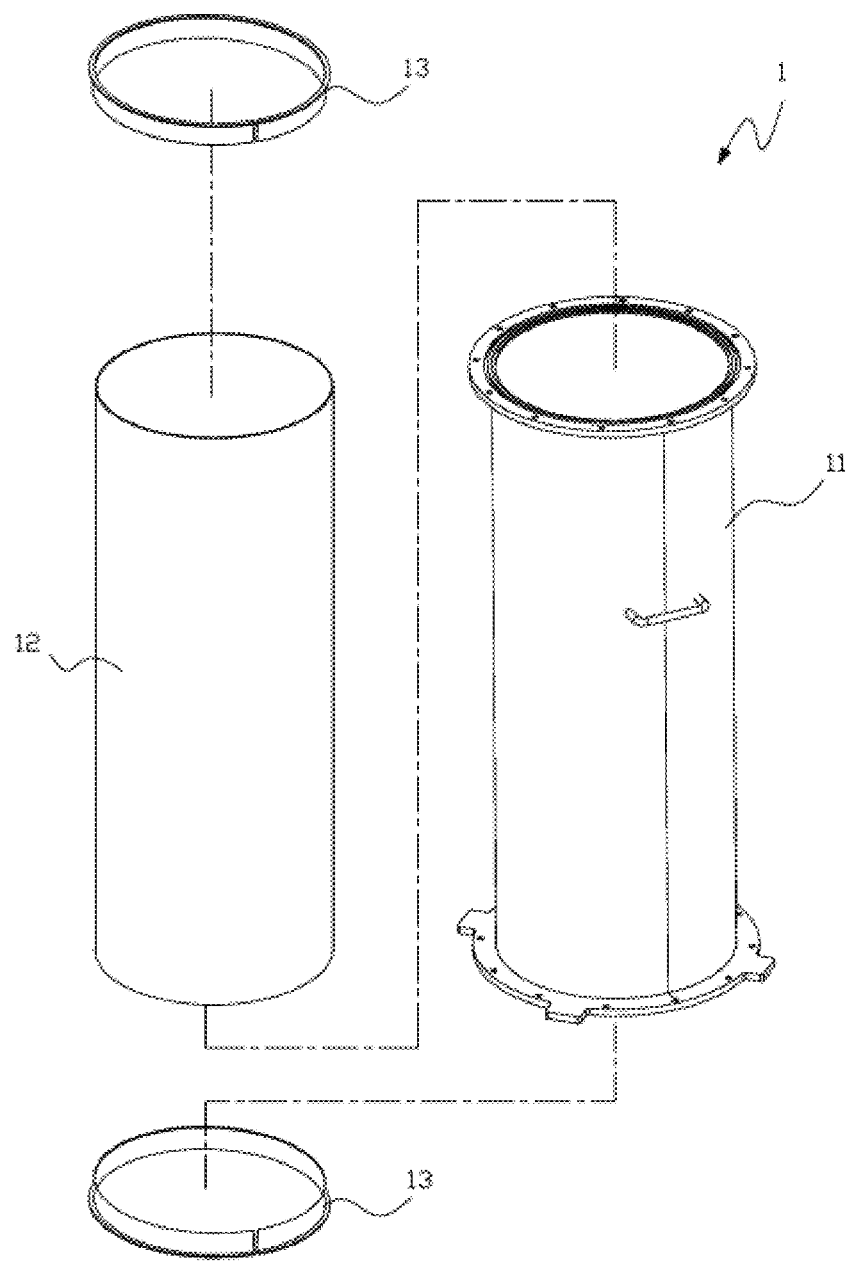
FIG. 4 is a view of a structure of a housing unit according to the embodiment of the present invention.
Figure 5:
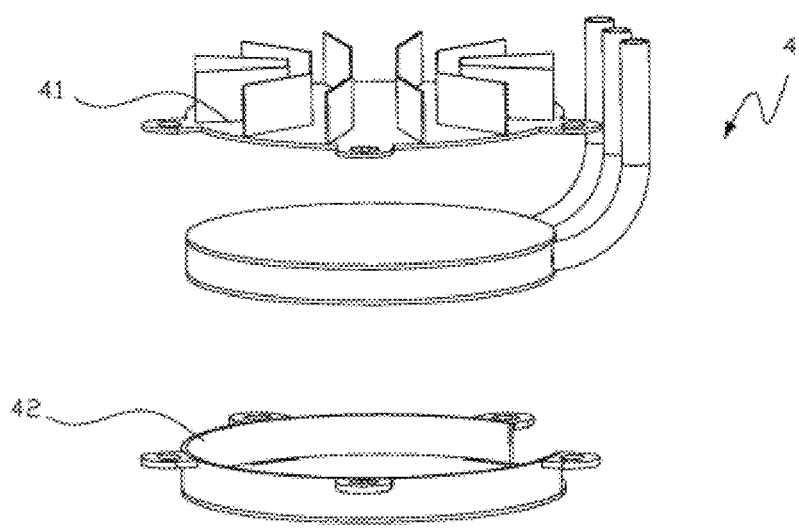
FIG. 5 is a view of a structure of a heater according to the embodiment of the present invention.
Figure 6:
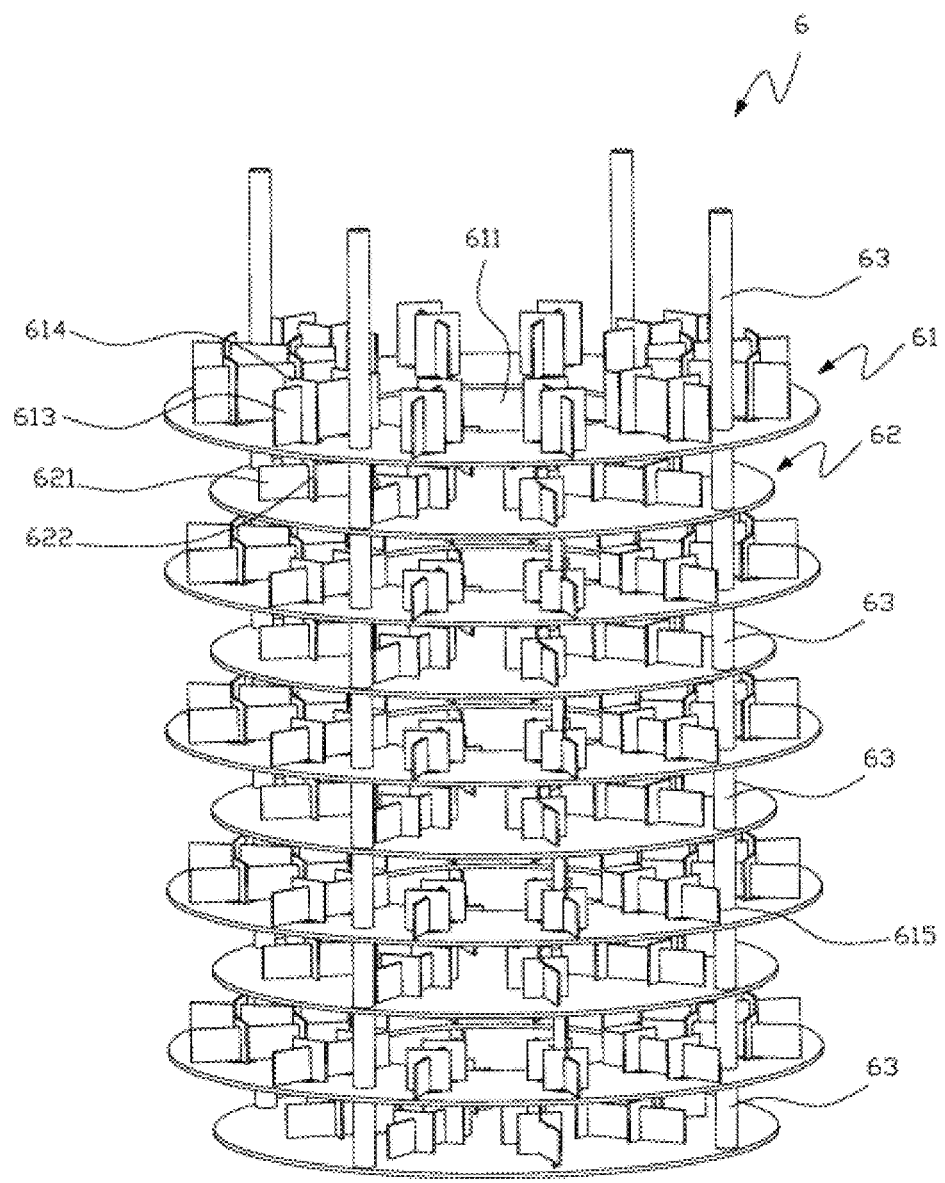
FIG. 6 is a perspective view of an upper internal collecting tower according to the embodiment of the present invention.
Figure 7:
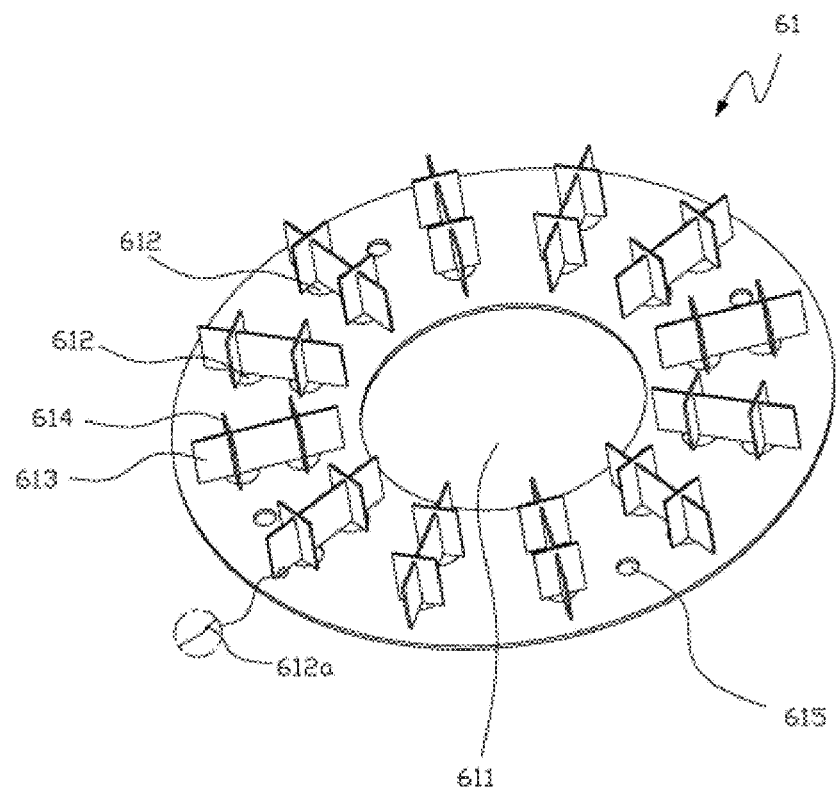
FIG. 7 is a view of a structure of a first collecting plate constituting the upper internal collecting tower according to the embodiment of the present invention.
Figure 8:
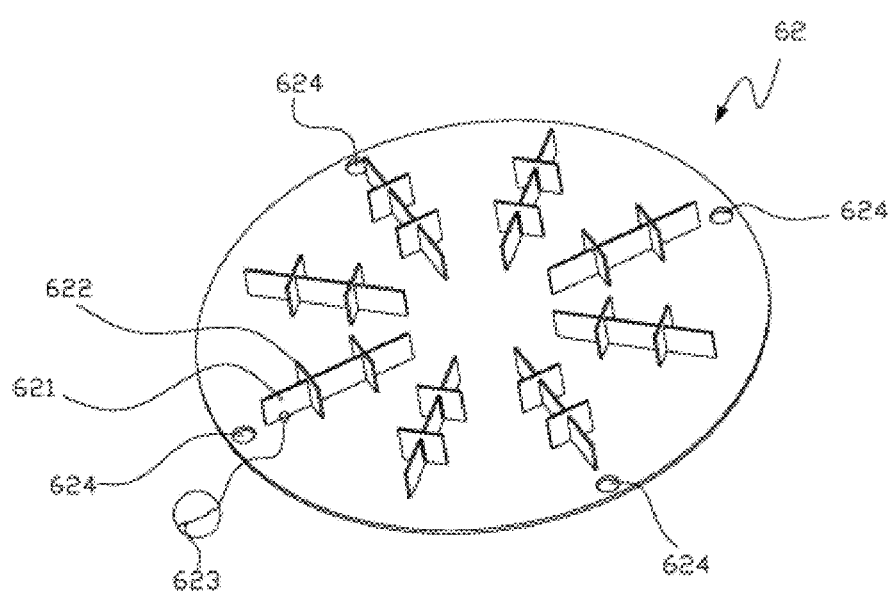
FIG. 8 is a view of a structure of a second collecting plate constituting the upper internal collecting tower according to the embodiment of the present invention.
Figure 9:
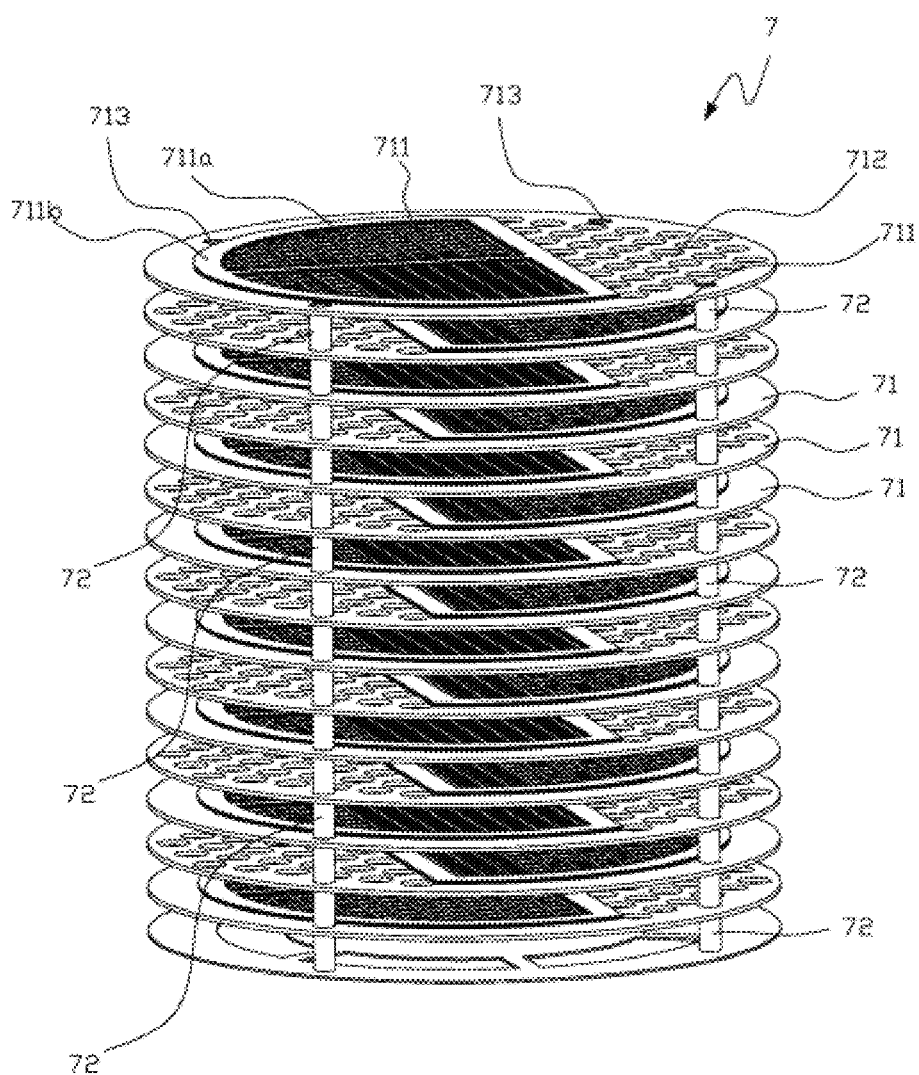
FIG. 9 is a perspective view of a lower internal collecting tower according to the embodiment of the present invention.
Figure 10:
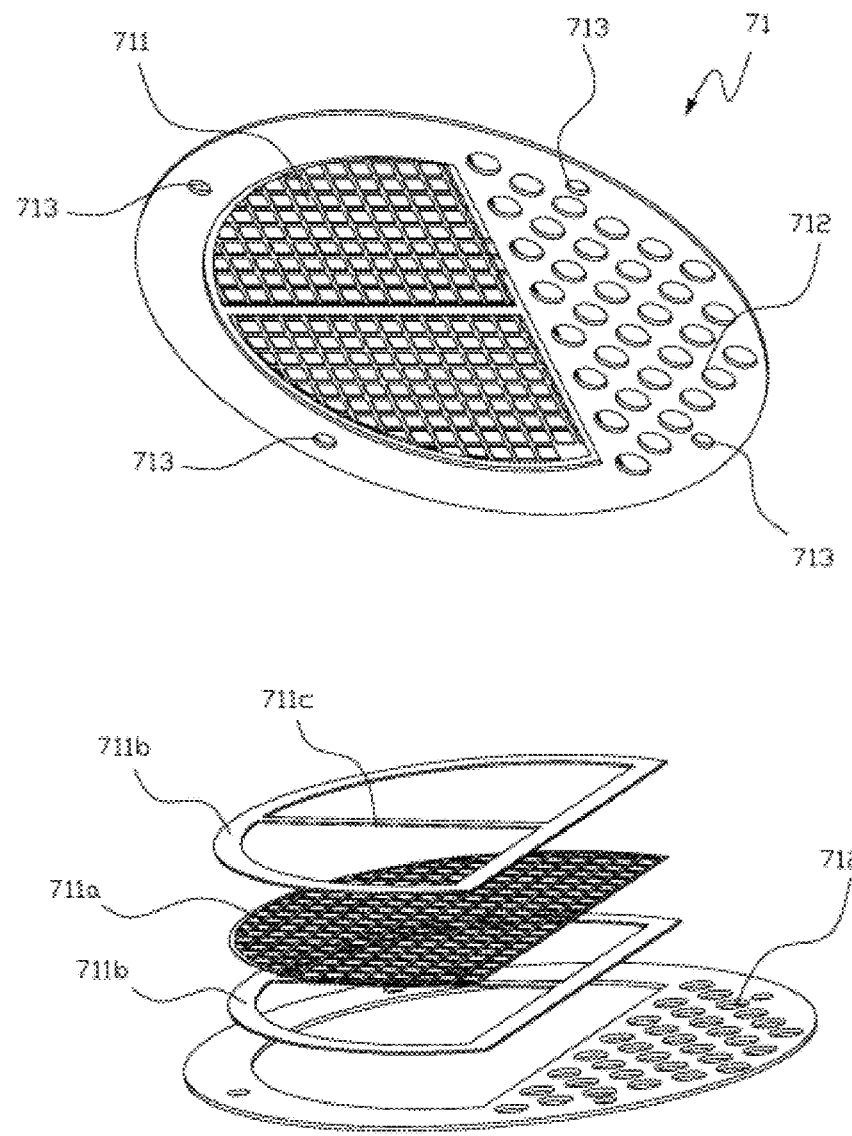
FIG. 10 are views of a structure of a third collecting plate constituting the lower internal collecting tower according to the embodiment of the present invention.

FIG. 1 is a perspective view of an apparatus for collecting a by-product according to an embodiment of the present invention; FIG. 2 is an exploded-perspective view of the apparatus for collecting a by-product in which a heating jacket is removed according to the embodiment of the present invention; FIG. 3 is a cross-sectional view of an internal structure of the apparatus for collecting a by-product according to the embodiment of the present invention; FIG. 4 is a view of a structure of a housing unit according to the embodiment of the present invention; FIG. 5 is a view of a structure of a heater according to the embodiment of the present invention; FIG. 6 is a perspective view of an upper internal collecting tower according to the embodiment of the present invention; FIG. 7 is a view of a structure of a first collecting plate constituting the upper internal collecting tower according to the embodiment of the present invention; FIG. 8 is a view of a structure of a second collecting plate constituting the upper internal collecting tower according to the embodiment of the present invention; FIG. 9 is a perspective view of a lower internal collecting tower according to the embodiment of the present invention; and FIG. 10 is a view of a structure of a third collecting plate constituting the lower internal collecting tower according to the embodiment of the present invention.

As illustrated in the drawings, the apparatus for collecting a by-product in a semiconductor manufacturing process according to the present invention serves to coagulate exhaust gas, to collect the exhaust gas as a by-product for purification, and to discharge the by-product to a vacuum pump, the exhaust gas containing tungsten hexafluoride (hereinafter, referred to as $WF_6$) and being discharged after used in a process chamber as a process gas during the semiconductor manufacturing process. The apparatus is fundamentally configured to include: the housing unit closed with an upper plate and a lower plate; a heater and a heating jacket heating the exhaust gas introduced through an inlet of the upper plate; and the upper internal collecting tower and the lower internal collecting tower provided inside the housing unit and coagulating the exhaust gas containing $WF_6$ and collecting a by-product such that a remaining exhaust gas is discharged through an outlet of the lower plate.

In order to prevent corrosion or the like, most components of the apparatus for collecting a by-product in a semiconductor manufacturing process to be described below are made of a material capable of preventing corrosion, such as titanium, stainless steel, and aluminum.

A configuration of the apparatus for collecting a by-product in a semiconductor manufacturing process according to the present invention will be described below in detail.

There is provided a housing unit 1 providing a space where the exhaust gas introduced from the process chamber is accommodated and where the by-product is coagulated and collected. That is, the housing unit is configured to store the exhaust gas so that the exhaust gas introduced into the upper and lower internal collecting towers provided therein is coagulated and collected.

The housing unit 1 includes: a cylindrical housing main body 11; a cylindrical inner housing 12 being replaceable and provided in a manner being brought into contact with an inner wall surface of the housing main body; and cylindrical housing rings 13 provided at upper and lower portions of the housing main body respectively in a manner being fastened to upper and lower portions of an inner wall of the inner housing to press and fix the inner housing to the inside of the housing main body.

The inner housing 12 may be formed in a single circular tube or a vertically-cut circular tube.

A shape of the housing rings 13 is configured such that each one end of the housing rings 13 is bent so as not to be dislodged when the housing rings 13 are fitted on upper and lower sides of the housing main body 11, respectively. In addition, the housing ring may be formed in a shape in which one point thereof is cut so as to correspond to the diameter of the housing main body. Alternatively, the housing ring may be formed to have an elastic force so as to be brought into close contact with the housing main body.

With the above configuration, the inner housing 12 is firmly fitted to the housing main body 11 in a manner being in surface contact therewith, so that the inner housing 12 receives heat of the heating jacket disposed outside the inner housing 12.

In addition, a by-product adhered inside may be cleaned by a sandblasting process.

When the effect of cleaning the adhered by-product is not sufficient, the inner housing may be withdrawn and replaced after the upper and lower housing rings 13 are quickly removed.

Such a rapid replacement method enables the apparatus to be operated continuously.

In addition, handles may be selectively provided outside the housing main body 11 for installation and movement.

An upper portion of the housing unit is provided with an upper plate 2 serving as a lid. To serve as a lid, the upper plate is fastened to the upper end of the housing unit by fastening means such as bolts and a flange provided by welding or the like.

The upper plate allows the exhaust gas to be supplied to the housing unit through a cylindrical inlet 21 protruding outside upward at a point (central portion), and a coolant flow path 22 is formed into a recess on an upper surface of the upper plate for temperature control to collect a by-product introduced into the housing unit.

An upper portion of the coolant flow path 22 is configured to be closed by a flow path cover. Here, although the lid cover is not illustrated in the drawings, the flow path cover may be fastened including a water tight seal interposed between the flow path cover and the coolant flow path 22, and the fastening method may be achieved by known techniques such as fitting, welding, bolt fastening, and the like.

The coolant flow path 22 is configured to circulate coolant such that the coolant is introduced by a coolant line connected to an external coolant tank (not illustrated) and a coolant inlet 22b connected to a quick connector 22a and then discharged through a coolant outlet 22c. The coolant flow path is configured to have a boundary portion such that ends thereof do not communicate with each other and thus supplied coolant and discharged coolant are not mixed with each other. The coolant may be water or a refrigerant.

The coolant flow path 22 thus formed effectively prevents the upper plate from being overheated and damaged by the heater. In addition, the coolant flow path 22 provides a temperature region where the introduced exhaust gas heated to a high temperature by the heater is efficiently collected in the vicinity of the upper internal collecting tower located below the upper plate. Although this cooling effect serves to quickly cool the exhaust gas containing $WF_6$ to be coagulated and collected in a state where the high temperature is maintained for a long period of time, a more important role of this cooling effect is to prevent an unillustrated O-ring which is disposed below the upper plate from being deformed by the heated upper plate, so that deterioration of the airtight function of the O-ring is prevented.

The upper plate is provided with a heater power supply 23 supplying power to the heater provided on the bottom surface thereof and including a temperature sensor measuring the temperature for controlling the power supply according to the internal temperature.

In addition, multiple fasteners 24 having internal threads are provided at a lower portion of the upper plate in a manner being circularly arranged downward in order to fasten the upper internal collecting tower and the heater together.

Some of the fasteners are fastened with fastening rods 25 passing through the upper internal collecting tower and fastening with the fasteners so that the upper internal collecting tower is suspended thereby. The fastening rods are formed in a kind of a stud bolt. At least both opposite ends of each fastening rod have threads such that the upper portion of the fastening rod is screwed with the fastener, and the lower portion of the fastening rod passes through the upper internal collecting tower and is screwed with a nut securely.

In addition, the rest of the fasteners are screwed to the heater with bolts to fasten the heater.

A lower portion of the housing unit is provided with a lower plate 3 serving as a lid. To serve as a lid, the lower plate is fastened to the lower end of the housing unit by fastening means such as bolts and a flange provided by welding or the like.

The lower plate allows the exhaust gas performed the collecting reaction to be discharged to the external vacuum pump and the scrubber through the cylindrical outlet 31 protruding outside downward at a point (central portion).

The lower plate is provided with multiple spacers 32 which are provided upward to space the lower internal collecting tower apart from the bottom by a predetermined distance.

In addition, fastening rods 33 are provided in each of the spacers. The fastening rods 33 pass through the lower internal collecting tower to fasten and support the lower internal collecting tower. The fastening rods are formed in a kind of a stud bolt. At least both opposite ends of each fastening rod have threads such that the lower portion of the fastening rod is screwed with a thread formed inside each spacer, and the upper portion of the fastening rod is screwed with a nut to fasten the lower internal collecting tower securely.

A heater 4 is provided below the upper plate to heat and uniformly distribute the exhaust gas containing $WF_6$ and introduced into the housing unit.

The heater is attached and brought into contact with the bottom surface of the inlet formed in the upper plate by using fastening means such as bolts or welding.

The heater is provided with a heat radiating portion 41 at an upper portion thereof, the heat radiating portion 41 having multiple radiating fins arranged radially so as to radiate heat uniformly. In addition, the heater is provided with a protection cap 42 surrounding the heater to protect the heater. The protection cap serves to prevent corrosion of the heater during operation under a long-term exposure to high-temperature exhaust gas environment condition, so that the durability of the heater is prevented from being lowered. The protection cap is bolted and fastened to the fasteners 24 provided at the lower portion of the upper plate in a manner that bolts pass through holes formed around the heat radiating portion.

When the power is supplied to the heater 4 from the heater power supply unit 142 having the temperature sensor and provided on the upper surface of the upper plate, the heater generates heat of a predetermined temperature. The heater is made of ceramic or inconel material to prevent corrosion which may be caused by the exhaust gas.

The heater serves to prevent coagulation of the exhaust gas containing $WF_6$ and discharged from the process chamber right after the exhaust gas is introduced through the inlet provided on the upper plate such that the inlet is not clogged, and to provide the heat such that a high-temperature region of 200° C. or higher is created uniformly in the inner space of the housing unit to maximize the coagulation of the exhaust gas when the exhaust gas reaches the upper and lower internal collecting towers. In addition, the heater serves to evenly supply heat to the space surrounding the upper and lower internal collecting towers through the heat radiating portion having the radiating fins arranged radially such that uniform coagulation occurs.

A heating jacket 5 is provided along an outer circumference of the housing unit in a detachable manner and configured to provide heat to the housing unit.

The heating jacket 5 is configured to solve conventional problems simultaneously, wherein the problems are: a $WF_6$ by-product tends to be mainly collected only in the upper space of the collecting apparatus due to the heater provided on the upper portion of the housing portion whereby the collecting space is less utilized and the efficiency of collecting the by-product from $WF_6$ gas is lowered; a heating device is provided in a narrow and limited space; the heater is exposed to the exhaust gas, leading to corrosion; the heater is damaged during cleaning; and repair and replacement of the heater.

In order to solve the problems, the heating jacket is detachably provided outside the housing unit and has a heating wire 51 therein heated by power supply.

The heating jacket may be configured such that the heating wire 51 insulated by a covering material or the like is provided inside a jacket made of a flexible synthetic resin material so that the heating jacket is provided along the outer circumference of the cylindrical housing unit. Alternatively, the heating jacket may be configured such that the heating wire 51 insulated by a covering material or the like is provided inside a jacket made of at least one metal material formed to fit the outer shape of the cylindrical housing unit. The heating jacket may be provided detachably in zipper type, buckle type, Velcro type, or bolt-nut type depending on the material thereof. The heating jacket may also be fastened and provided detachably by using any one of not-mentioned other known fastening types.

In particular, the heating jacket according to the present invention is configured such that a region of the heating wire 51 provided inside the heat jacket to generate heat is configured to transmit the heat only to the upper portion and a middle portion of the housing unit. Due to the disposition of the heating wire 51, in the upper and middle portions of the housing unit, the high-temperature heat supplied by the heater and the heating jacket is transmitted to the inner housing 12, which is in surface contact through the housing main body 11, and the inner space is heated, whereby a $WF_6$ by-product is collected. On the other hand, in the lower portion of the housing unit where the heat of the heating wire 51 is not supplied, the provided heat is small so that a fine particulate by-product of the exhaust gas other than the $WF_6$ by-product is collected. Accordingly, the discharge of the $WF_6$ by-product through the outlet is maximally suppressed, thereby effectively suppressing the damage of the scrubber or the vacuum pump connected to the rear end.

In addition, according to the present invention, in the case the heating jacket having a different position of the heating wire 51 provided in the heating jacket is replaced and provided on the housing unit, it is possible to adjust the collection area of the $WF_6$ by-product collected in the inner space of the apparatus in a various way without changing the structure of the inside of the housing unit.

An upper internal collecting tower 6 is provided in an upper side of the inside of the housing unit 1. The upper internal collecting tower 6 is configured such that multiple first collecting plates 61 and multiple second collecting plates 62 having different shapes are alternately arranged at regular intervals in a vertical direction such that the exhaust gas flows inward and outward alternately, thereby forming a serpentine flow according to the shapes of the first collecting plates and the second collecting plates while the exhaust gas flows downward and thus the by-product is collected.

The upper internal collecting tower 6 is provided inside the housing unit in a manner hanging on the fasteners 24 provided in the lower portion of the upper plate by using the fastening rods 25 passing through the upper internal collecting tower 6. Here, the entire upper internal collecting tower is fastened in a manner that threads formed at the ends of the fastening rods are screwed with nuts through the bottom end of the last first collecting plate or the last second collecting plate located at the bottom end of the fastening rods.

Multiple tubular spacers 63 are arranged along the circumferential direction to space the first collecting plates 61 and the second collecting plates 62 apart from each other at regular intervals. The fastening rods pass through the spacers to securely fasten the first collecting plates 61 and the second collecting plates 62.

The height of the spacers 63 between the first collecting plate 61 and the second collecting plate 62 is set to be greater than the height of guide brackets or interference brackets, which will be described later.

The height of the spacers 63 at the uppermost end is set to be greater than the height of other spacers such that the uppermost collecting plate is hung on the upper plate while being spaced apart therefrom.

According to such disposement and configuration, as the moving direction, the moving distance, and the flow velocity of the exhaust gas are continuously changed, the contact area of the exhaust gas under the high temperature condition is increased, so that the $WF_6$ by-product is collected efficiently and descends.

Specifically, each first collecting plate 61 is configured in a disk shape having various holes for discharging the exhaust gas in the downward direction. The first collecting plate 61 is provided with a main exhaust hole 611 formed in the center portion, auxiliary exhaust holes 612 formed around the center portion, quadrangular guide brackets 613 formed on an upper surface thereof, and quadrangular interference brackets 614 cross-assembled to the guide brackets 613. The first collecting plate 61 is configured such that the introduced exhaust gas is discharged in the downward direction through the main exhaust hole 611 and the auxiliary exhaust holes 612 while the guide brackets 613 and the interference brackets 614 guide the exhaust gas at predetermined angles to allow the exhaust gas to flow and to delay the exhaust gas, respectively, so that the exhaust gas is collected efficiently on the surface. In one embodiment, two small interference brackets 614 and one guide bracket 613 are cross-assembled together.

To this end, the main exhaust hole is formed in the central portion of the surface of the first collecting plate 61 to discharge the exhaust gas, and the multiple auxiliary exhaust holes are formed around the main exhaust hole on the surface in a manner being arranged in the circumferential and the radial directions to discharge the exhaust gas. In addition, two or more auxiliary exhaust holes arranged in the circumferential and radial directions may be provided for one guide bracket. In this case, assembly holes 612a are formed in front of and behind the auxiliary exhaust holes such that the guide brackets guiding the flow of the exhaust gas are assembled in a fitting manner. It is also possible to weld a bonding site after fitting the guide brackets and fix the guide brackets.

In one embodiment, the interference brackets may be inserted in the guide brackets positioned on the auxiliary exhaust holes. When the interference brackets are installed in such positions, a part of the exhaust gas guided or interfered by the guide brackets or the interference brackets is discharged to the lower second collecting plate through the auxiliary exhaust holes 612 without moving to the main exhaust hole. The exhaust gas is mainly discharged through the main exhaust hole toward the lower second collecting plate.

In addition, fastening rod through-holes 615 through which the fastening rods pass for assembly are provided on the surface of the first collecting plate 61. The fastening rods passing through the fastening rod through-holes pass through the spacers provided on the fastening rod through-holes and then through fastening rod through-holes formed in the upper second collecting plate.

The second collecting plate 62 is configured in a disk shape having a closed structure in which the exhaust gas is discharged outward without being discharged directly downward. That is, the second collecting plate 62 is configured such that the exhaust gas mainly introduced through the main exhaust hole formed in the center of the first collecting plate 61 and the exhaust gas introduced through the auxiliary exhaust holes formed around the main exhaust hole are discharged outward horizontally while quadrangular guide brackets 621 formed on an upper surface thereof and quadrangular interference brackets 622 cross-assembled together to guide the exhaust gas at predetermined angles to allow the exhaust gas to flow and to delay the flow of exhaust gas, respectively, so that the exhaust gas is collected efficiently on the surface. In one embodiment, two small interference brackets 622 and one guide bracket 621 are cross-assembled together.

To this end, assembly holes 623 are formed in a manner being arranged radially on the surface of the second collecting plate 62, and the guide brackets guiding the flow of the exhaust gas are assembled in a fitting manner. It is also possible to weld a bonding site after fitting the guide brackets and fix the guide brackets.

In addition, fastening rod through-holes 624 through which the fastening rods pass for assembly are provided on the surface of the second collecting plate 62. The fastening rods passing through the fastening rod through-holes pass through the spacers provided on the fastening rod through-holes and then through fastening rod through-holes formed in the upper first collecting plate.

The surfaces of the first collecting plates and the second collecting plates are roughly processed to increase the contact area and to retard the flow of the exhaust gas, so that more exhaust gas is coagulated and collected as a by-product.

Surfaces of the guide brackets and the interference brackets are also roughly processed to increase the contact area and to retard the flow of the exhaust gas, so that more exhaust gas is coagulated and collected as a by-product.

In addition, the first collecting plates and second collecting plates are configured such that the guide brackets provided on upper surfaces of the first collecting plates and the second collecting plates placed on top of another are arranged radially in a manner being misaligned with each other to form a serpentine flow of the exhaust gas.

A lower internal collection tower 7 is provided below the upper internal collecting tower. In the lower internal collection tower 7, multiple third collecting plates 71 having the same shape are arrayed at regular intervals in a vertical direction, and each of the third collecting plates 71 has different regions. The third collecting plates 71 are arranged such that each region of each of the third collecting plates 71 is misaligned with a corresponding one of the regions of a next third collecting plate. Therefore, as the exhaust gas flows downward along the shape of the regions of the third collecting plates 71, the exhaust gas is coagulated and collected as the by-product.

The lower internal collection tower 7 is disposed inside the housing unit and on the spacers 32 provided on the lower plate. Fastening rods 33 screwed to the spacers pass through the lower internal collection tower 7 such that the lower internal collection tower 7 is installed. Here, the entire lower internal collecting tower is fastened in a manner that threads formed at the ends of the fastening rods are screwed with nuts through the top end of the last third collecting plate located at the top end of the fastening rods.

Multiple tubular spacers 72 are arranged along the circumferential direction to space the third collecting plates 71 apart from each other at regular intervals. The fastening rods of the lower plate pass through the spacers to securely fasten the third collecting plates 71.

According to such disposement and configuration of the third collecting plates, as the flow velocity of the exhaust gas is continuously changed, the contact area of the remaining exhaust gas in a state where a $WF_6$ by-product is removed at the upper internal collecting tower is increased, so that fine particulate by-product is collected efficiently and descends.

The $WF_6$ by-product is also generated in the lower internal collection tower 7, but the amount thereof is small because most of the $WF_6$ by-product is already collected at the upper internal collecting tower. In addition, with respect to the vertical height of the housing unit, since the high temperature is maintained at the upper and middle portions of the housing unit compared with the lower portion of the housing unit due to the disposition of the heating wire 51 provided in the heating jacket, the relatively high efficiency of collecting the $WF_6$ by-product is indicative of the difference in the amount collected by-product.

In addition, in the lower internal collection tower 7, due to the difference in the flow velocity of the exhaust gas flowing downward, some of the exhaust gas flows downward after being delayed, and some of the exhaust gas flows downward after moving to the other region where the flow velocity is fast from the retarded region. However, the main flow of the exhaust gas maintains the state of flowing downward in the region other than the flow in the radial direction of the third collecting plates 71.

Specifically, the third collecting plates 71 is configured such that exhaust structures of the perforated regions formed on the same plane have different shapes to generate a difference in the flow velocity of the exhaust gas when discharging the introduced exhaust gas downward. That is, the disk-shaped third collecting plate 71 is constituted by a mesh region 711 and a perforated region 712 in which multiple circular holes are arranged. In one embodiment, the mesh region may be configured to have an area larger than the perforated region.

As a result, the flow in the mesh region of any one of the third collecting plates 71 is fast, and the flow in the perforated region of the third collecting plate 71 is delayed.

In addition, in the third collecting plate 71 disposed below another third collecting plate 71 arranged to be misaligned with each other, the exhaust gas delayed from the perforated region of the above third collecting plates 71 is introduced into the mesh portion and becomes fast, and the exhaust gas flowing fast from the mesh region of the above third collecting plates 71 is introduced into the perforated region and becomes slow.

The mesh region 711 is prepared by processing a surface of the third collecting plates 71 into an opening according to a shape of a mesh 711*a*. Then, guides 711*b* are prepared which overlap the boundary of the mesh 711*a* and the boundary of a region of the third collecting plate where the opening is not formed. Thereafter, the guides 711*b* are placed on and under the mesh and fixed by welding or the like. Although the boundary of the mesh is fixed by the guides 711*b*, a division guide 711*c* may be further provided, crossing a middle portion of the mesh to prevent the mesh from being shaken or released by the exhaust gas.

In addition, fastening rod through-holes 713 through which the fastening rods pass for assembly are provided on the surface of the third collecting plate 71. The fastening rods passing through the fastening rod through-holes pass through the spacers provided on the fastening rod through-holes and then through fastening rod through-holes formed in the upper third collecting plate.

As the multiple third collecting plates 71 having such a structure are alternately arrayed at regular intervals in the vertical direction in a manner such that the region of the third collecting plate 71 is misaligned with a corresponding one of the region of a next third collecting plates 71, the exhaust gas flows downward along the shape of the regions of the third collecting plates 71. Due to the difference in flow velocity, some of the exhaust gas flows downward after being delayed, and some of the exhaust gas flows from the retarded region toward other region where the flow velocity is fast.

Therefore, the exhaust gas generally flows downward in the third collecting plates 71, but in each of third collecting plates 71, some of the exhaust gas flows between the mesh region 711 and the perforated region 712 while flowing downward.

In addition, the surfaces of the third collecting plates are roughly processed to increase the contact area and to retard the flow of the exhaust gas, so that more exhaust gas is coagulated and collected as a by-product.

A transfer unit 8 having casters may be provided underneath the lower plate.

The transfer unit is constituted by multiple legs 81 coupled to the lower plate and casters 82 provided under each of the legs 81. Thus, it is possible to quickly move the apparatus to a required position in a state where the apparatus is set at a required height.

The casters are configured to include rollers and fastening and releasing means.

Hereinafter, the operation of the apparatus having the above-described configuration according to the present invention, the flow of the exhaust gas and the collecting tendency will be described.

Figure 11:
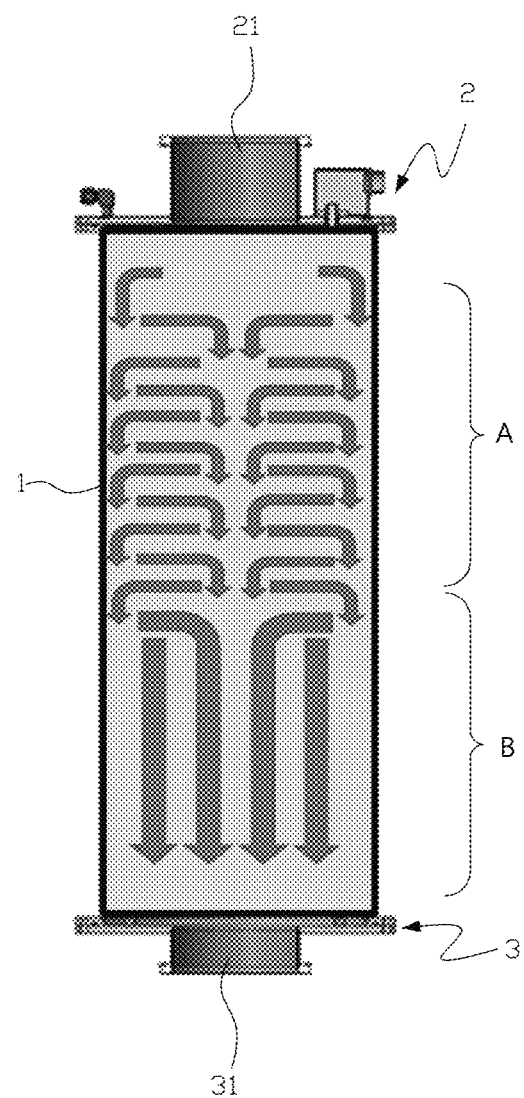
FIG. 11 is an exemplary view of a gas flow inside the apparatus for collecting a by-product according to the embodiment of the present invention.
Figure 12:
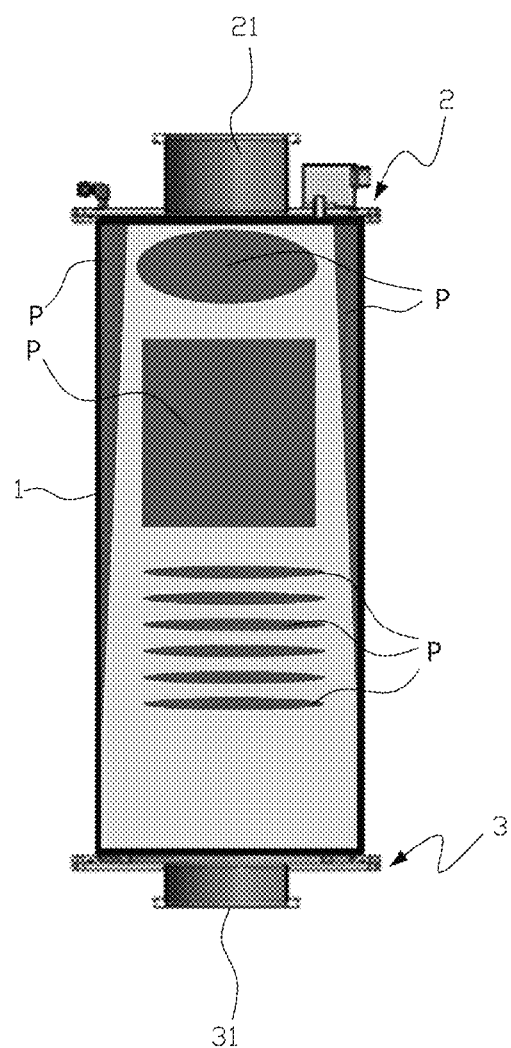
FIG. 12 is an exemplary view of a collecting tendency inside the apparatus for collecting a by-product according to the embodiment of the present invention.

FIG. 11 is an exemplary view of a gas flow inside the apparatus for collecting a by-product according to the embodiment of the present invention; and FIG. 12 is an exemplary view of a collecting tendency inside the apparatus for collecting a by-product according to the embodiment of the present invention.

As illustrated in the drawings, the exhaust gas introduced through the inlet of the upper plate of the housing unit flows in the housing unit uniformly heated by the heater and the heating jacket.

In particular, in an upper region A where the upper internal collecting tower is located, the exhaust gas flows inward and outward repeatedly due to the disposement and the shapes of the first collecting plate and the second collecting plate, so that a serpentine flow is generated.

After the exhaust gas passes through the upper internal collecting tower and goes through the collecting action, the exhaust gas flows downward and is introduced into the lower internal collecting tower spaced apart at a predetermined distance from the upper internal collecting tower.

In a lower region B where the lower internal collecting tower is located, due to the shapes of the regions of the third collecting plates, the exhaust gas mainly flows downward and toward the outlet provided at the lower plate without flowing inward and outward repeatedly.

In addition, the collecting tendency shows that a by-product P of the exhaust gas including the introduced $WF_6$ is coagulated and collected mainly in a region below the inlet provided at the upper plate of the housing unit, the upper and middle portions of the housing unit, and the upper internal collecting tower. On the other hand, the collecting tendency shows that a smaller amount of the by-product P of the exhaust gas including the introduced $WF_6$ is coagulated and collected in the lower internal collecting tower than the region below the inlet provided at the housing unit, the upper and middle portions of the housing unit, and the upper internal collecting tower.

Such a trapping tendency occurs because the heater and the heating wire wound around the heating jacket uniformly provides the high temperature at which $WF_6$ can be collected well in the regions.

Figure 13:
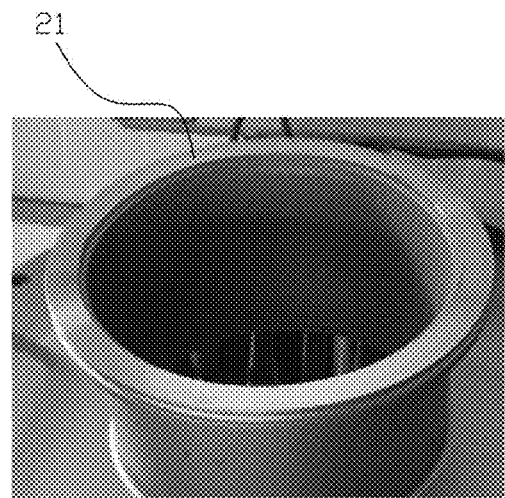
FIGS. 13 to 17 show photographs of collected by-product in different regions of the apparatus for collecting a by-product according to the embodiment of the present invention.
Figure 14:
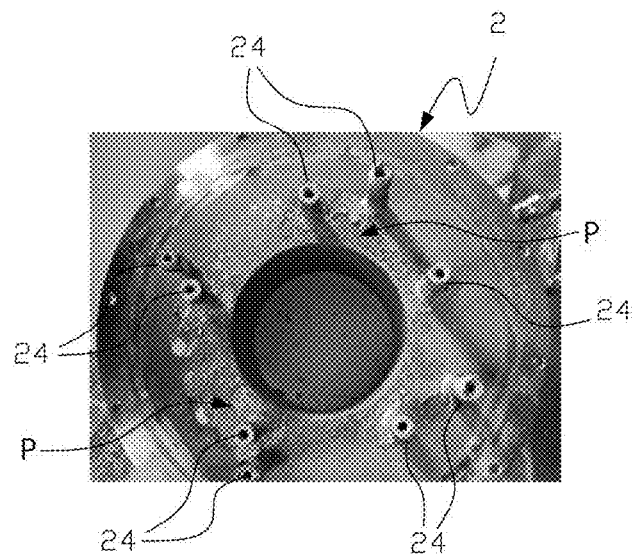
Figure 15:
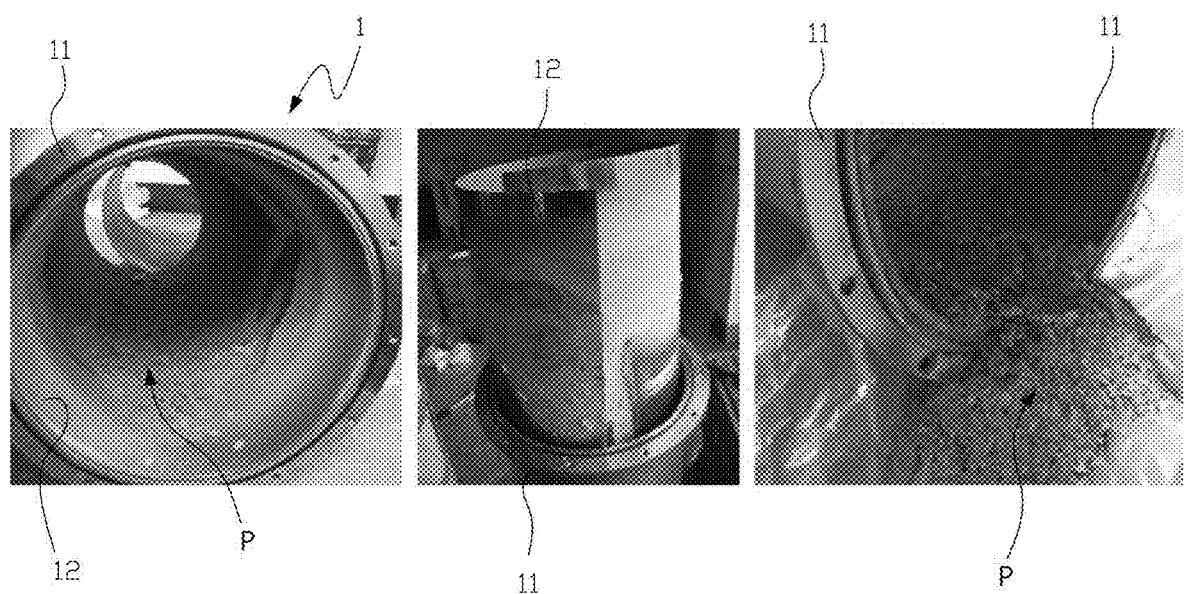
Figure 16:
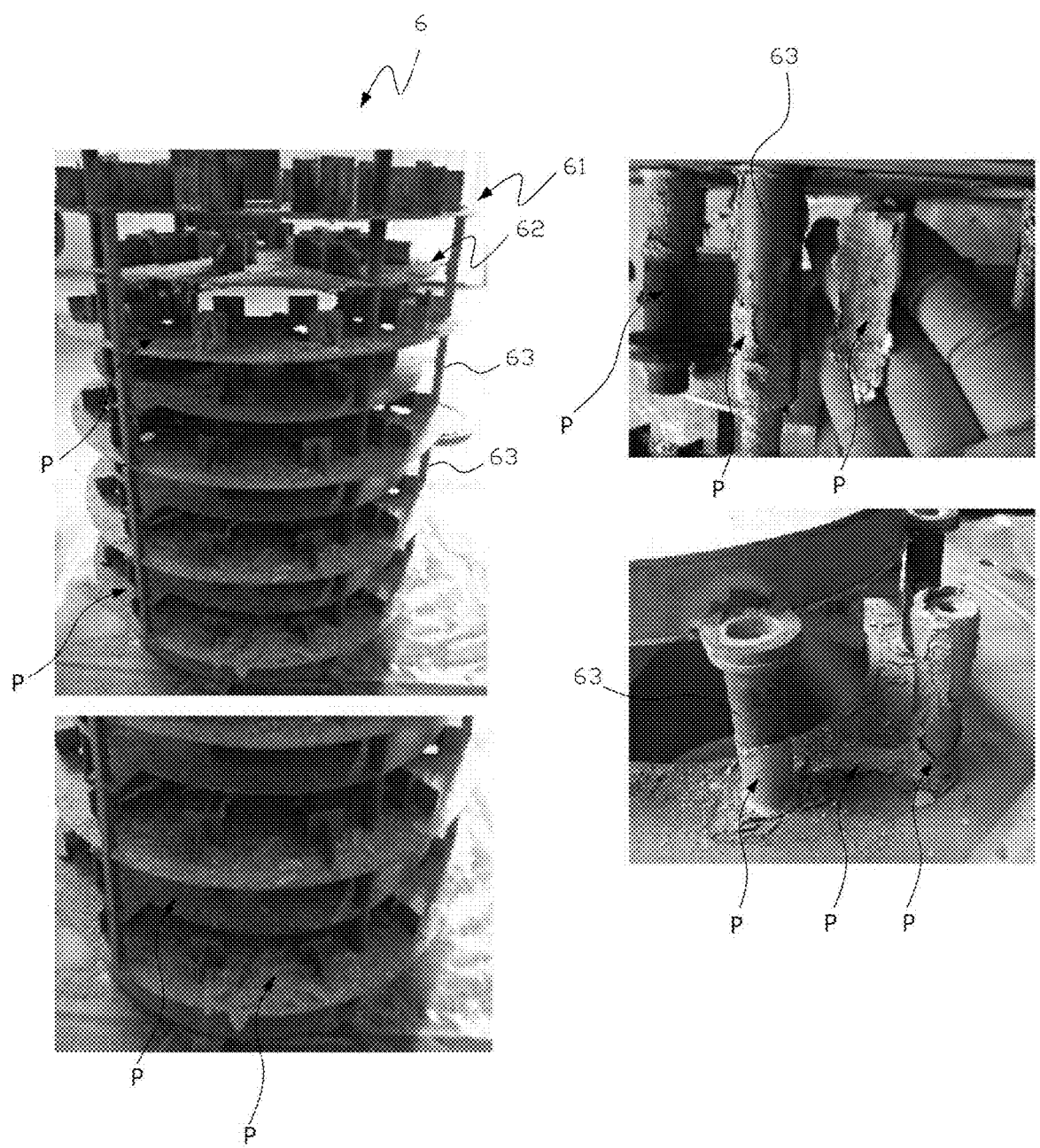
Figure 17:
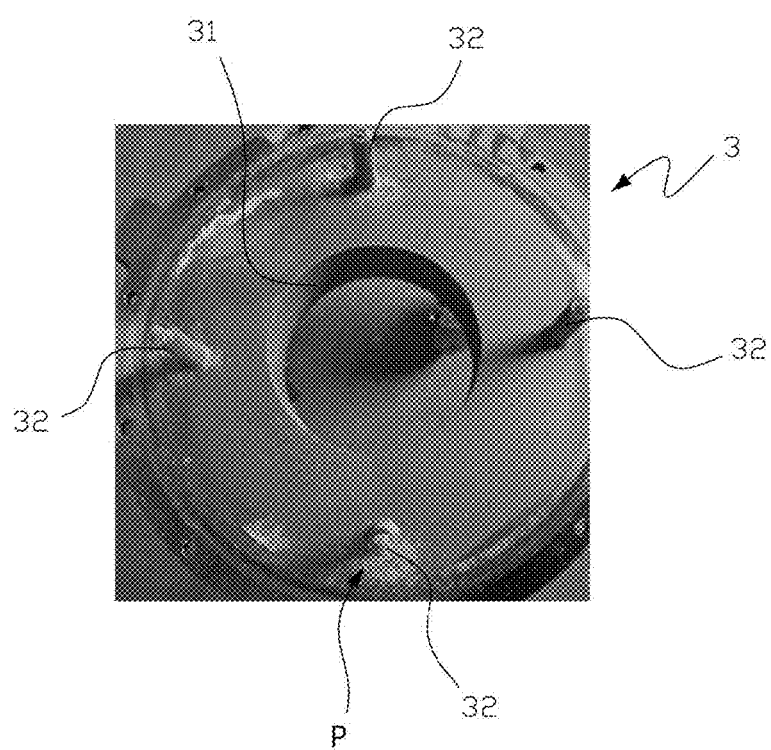

FIGS. 13 to 17 show photographs of collected by-product in different regions of the apparatus for collecting a by-product according to the embodiment of the present invention, wherein FIG. 13 is a photograph of the inlet of the upper plate; FIG. 14 is a photograph of the lower surface of the upper plate; FIG. 15 are photographs of the inside of the housing unit; FIG. 16 are photographs of the upper internal collecting tower; and FIG. 17 is a photograph of the upper surface of the lower plate.

The photographs show the apparatus for collecting a by-product according to the embodiment of the present invention in which the by-product is collected inside the apparatus after 378 days of operation, wherein the amount of collected by-product was 1.05 kg. During the operation, there was no replacement of the vacuum pump connected to the rear end of the vacuum pump.

As shown in the photographs, most of $WF_6$ contained in the exhaust gas is coagulated and collected as the by-product P in the region below the inlet provided at the upper plate and in the upper internal collecting tower. The remaining $WF_6$ is collected in small quantities as the by-product P on the lower plate.

Although the embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for collecting a by-product in a semiconductor manufacturing process, the apparatus provided on a line between a process chamber and a vacuum pump and the apparatus comprising:
    a housing unit providing a space where exhaust gas discharged from the process chamber and containing tungsten hexafluoride ($WF_6$) is accommodated to collect a by-product from the exhaust gas and where the by-product is coagulated and collected, the housing unit having an upper plate provided with an inlet at an upper portion thereof and a lower plate provided with an outlet at a lower portion thereof;
    a heater heating the exhaust gas introduced into the housing unit; and
    an internal collecting tower coagulating the exhaust gas and collecting the by-product,
    wherein the apparatus further comprises:
    a heating jacket detachably provided along an outer circumference of the housing unit to provide heat;
    an upper internal collecting tower configured such that multiple first collecting plates and multiple second collecting plates having different shapes are alternately arranged at regular intervals in a vertical direction such that the exhaust gas flows inward and outward alternately, thereby forming a serpentine flow according to the shapes of the first collecting plates and the second collecting plates while the exhaust gas flows downward and thus the by-product is collected; and
    a lower internal collection tower configured such that multiple third collecting plates having the same shape are arranged at regular intervals in the vertical direction and each of the third collecting plates has different regions on a surface thereof such that each region of each of the third collecting plates is misaligned with a corresponding one of the regions of a next third collecting plate, thereby the exhaust gas flows downward along the shapes of the regions of the third collecting plates and thus the by-product is collected.

2. The apparatus of claim 1, wherein the upper internal collecting tower and the lower internal collecting tower are vertically spaced apart from each other at a predetermined distance.

3. The apparatus of claim 1, wherein the heating jacket is configured such that a heating wire provided to generate heat is positioned in a predetermined region.

4. The apparatus of claim 3, wherein the heating jacket is configured such that the heat of the heating wire is transmitted only to an upper portion and a middle portion of the housing unit.

5. The apparatus of claim 1, wherein each of the first collecting plates includes:
a main exhaust hole formed in a central portion and an auxiliary exhaust hole formed around the central portion to discharge the exhaust gas downward; and
guide brackets and interference brackets provided on an upper surface of the first collecting plate, the guide brackets and the interference brackets being cross-assembled together and functioning to guide the exhaust gas to flow at predetermined angles and to delay a flow of the exhaust gas, respectively.

6. The apparatus of claim 5, wherein surfaces of the guide brackets and the interference brackets are roughly processed to increase a contact area and to delay the flow of the exhaust gas.

7. The apparatus of claim 1, wherein each of the second collecting plates has a closed structure to discharge the exhaust gas radially and includes guide brackets and interference brackets cross-assembled together on an upper surface thereof to guide the exhaust gas to flow at predetermined angles and to delay a flow of the exhaust gas, respectively.

8. The apparatus of claim 7, wherein surfaces of the guide brackets and the interference brackets are roughly processed to increase a contact area and to delay the flow of the exhaust gas.

9. The apparatus of claim 1, wherein each of the third collecting plates includes a mesh region and a perforated region in which multiple circular holes are arranged.

10. The apparatus of claim 9, wherein the mesh region is fixed to a region of each of the third collecting plates which is processed to have an opening according to a shape of a mesh by upper and lower guides.

11. The process of claim 1, wherein surfaces of the first collecting plates, the second collecting plates, and the third collecting plates are roughly processed to increase a contact area and to delay a flow of the exhaust gas.

12. The apparatus of claim 1, wherein the first collecting plates and second collecting plates are configured such that guide brackets provided on upper surfaces of the first collecting plates and the second collecting plates placed on top of another are arranged radially in a manner being misaligned with each other to form a serpentine flow of the exhaust gas.

13. The apparatus of claim 1, wherein multiple tubular spacers are provided to space the first collecting plates and the second collecting plates apart from each other in the vertical direction and space the third collecting plates apart from each other in the vertical direction,
wherein the spacers are arranged along a circumferential direction, and
fastening rods passing through fixing rod through-holes formed in the first collecting plates, the second collecting plates, and the third collecting plates pass through the spacers to fix the first collecting plates, the second collecting plates, and the third collecting plates.

14. The apparatus of claim 1, wherein the housing unit includes:
a housing main body;
a cylindrical inner housing being replaceable and provided in a manner being brought into contact with an inner wall surface of the housing main body; and
cylindrical housing rings provided at upper and lower portions of the housing main body respectively in a manner being fastened to upper and lower portions of an inner wall of the inner housing to fasten the inner housing to the inside of the housing main body.

15. The apparatus of claim 1, wherein an upper portion of the upper plate is configured such that a coolant flow path is provided on an upper surface of the upper plate for temperature control to collect the by-product introduced into the housing unit, and
a lower portion of the upper plate is configured with multiple fasteners such that some of the fasteners are fastened with fastening rods passing through the upper internal collecting tower so that the upper internal collecting tower is suspended thereby, and the remaining fastening rods are fastened with the heater to fix the heater.

16. The apparatus of claim 1, wherein the lower plate includes:
multiple spacers provided upward to space the lower internal collecting tower apart from the bottom by a predetermined distance; and
fastening rods provided in each of the spacers and passing through the lower internal collecting tower to fasten and support the lower internal collecting tower.

17. The apparatus of claim 1, wherein the heater includes:
a heat radiating portion provided at an upper portion thereof and having multiple radiating fins radially arranged to radiate heat uniformly; and
a protection cap surrounding the heater to protect the heater.

18. The apparatus of claim 1, further comprising:
a transfer unit having multiple legs provided under the lower plate and casters provided under each of the legs.

* * * * *